US012237381B2

(12) United States Patent
Karmous

(10) Patent No.: US 12,237,381 B2
(45) Date of Patent: Feb. 25, 2025

(54) MESA CONTACT FOR MOS CONTROLLED POWER SEMICONDUCTOR DEVICE AND METHOD OF PRODUCING A POWER SEMICONDUCTOR DEVICE

(71) Applicant: Infineon Technologies AG, Neubiberg (DE)

(72) Inventor: Alim Karmous, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 541 days.

(21) Appl. No.: 17/680,456

(22) Filed: Feb. 25, 2022

(65) Prior Publication Data

US 2022/0271132 A1 Aug. 25, 2022

(30) Foreign Application Priority Data

Feb. 25, 2021 (DE) .......................... 102021104532.0

(51) Int. Cl.
| H01L 29/417 | (2006.01) |
| H01L 27/06 | (2006.01) |
| H01L 29/10 | (2006.01) |
| H01L 29/66 | (2006.01) |
| H01L 29/739 | (2006.01) |

(52) U.S. Cl.
CPC .... *H01L 29/41708* (2013.01); *H01L 27/0664* (2013.01); *H01L 29/1095* (2013.01); *H01L 29/66348* (2013.01); *H01L 29/7397* (2013.01)

(58) Field of Classification Search
CPC .................. H01L 23/544; H01L 21/78; H01L 2223/5446; H01L 22/32; H01L 23/585; H01L 23/562
See application file for complete search history.

(56) References Cited

U.S. PATENT DOCUMENTS

| 2014/0231867 A1* | 8/2014 | Yamashita | .......... H01L 29/7813 257/140 |
| 2015/0014743 A1* | 1/2015 | Werber | ............... H01L 29/0834 257/140 |
| 2015/0179636 A1* | 6/2015 | Pfirsch | ................ H01L 29/1095 257/140 |
| 2016/0079238 A1* | 3/2016 | Siemieniec | ........... H01L 29/401 257/140 |

(Continued)

*Primary Examiner* — Victor A Mandala
(74) *Attorney, Agent, or Firm* — Murphy, Bilak & Homiller, PLLC

(57) ABSTRACT

A power semiconductor device includes: a semiconductor body having a first surface and a mesa portion that includes a surface part of the first surface and a body region; at least two trenches extending from the first surface into the semiconductor body along a vertical direction, each trench including a trench electrode and trench insulator insulating the trench electrode from the semiconductor body, the mesa portion being laterally confined by the trenches in a first vertical cross-section along a first lateral direction; and a contact plug in contact with the body region. The contact plug and trench electrode of a first trench laterally overlap at least partially in the first vertical cross-section. A protection structure having a portion arranged within the first trench is arranged between the contact plug and trench electrode of the first trench. The protection structure may be an electrically insulation structure or a protective device structure.

20 Claims, 9 Drawing Sheets

(56) References Cited

U.S. PATENT DOCUMENTS

| | | | |
|---|---|---|---|
| 2016/0300913 A1* | 10/2016 | Siemieniec | H01L 29/0696 |
| 2017/0040316 A1* | 2/2017 | Soeno | H01L 21/8249 |
| 2017/0040423 A1* | 2/2017 | Inoue | H01L 29/7813 |
| 2017/0077299 A1* | 3/2017 | Shimizu | H01L 29/41766 |
| 2019/0115436 A1* | 4/2019 | Hossain | H01L 29/872 |
| 2020/0066887 A1 | 2/2020 | Imai | |
| 2020/0243641 A1* | 7/2020 | Nakagawa | H01L 29/0623 |
| 2022/0069079 A1* | 3/2022 | Queitsch | H01L 29/0653 |
| 2023/0215942 A1* | 7/2023 | Tanaka | H01L 29/66068 |

\* cited by examiner

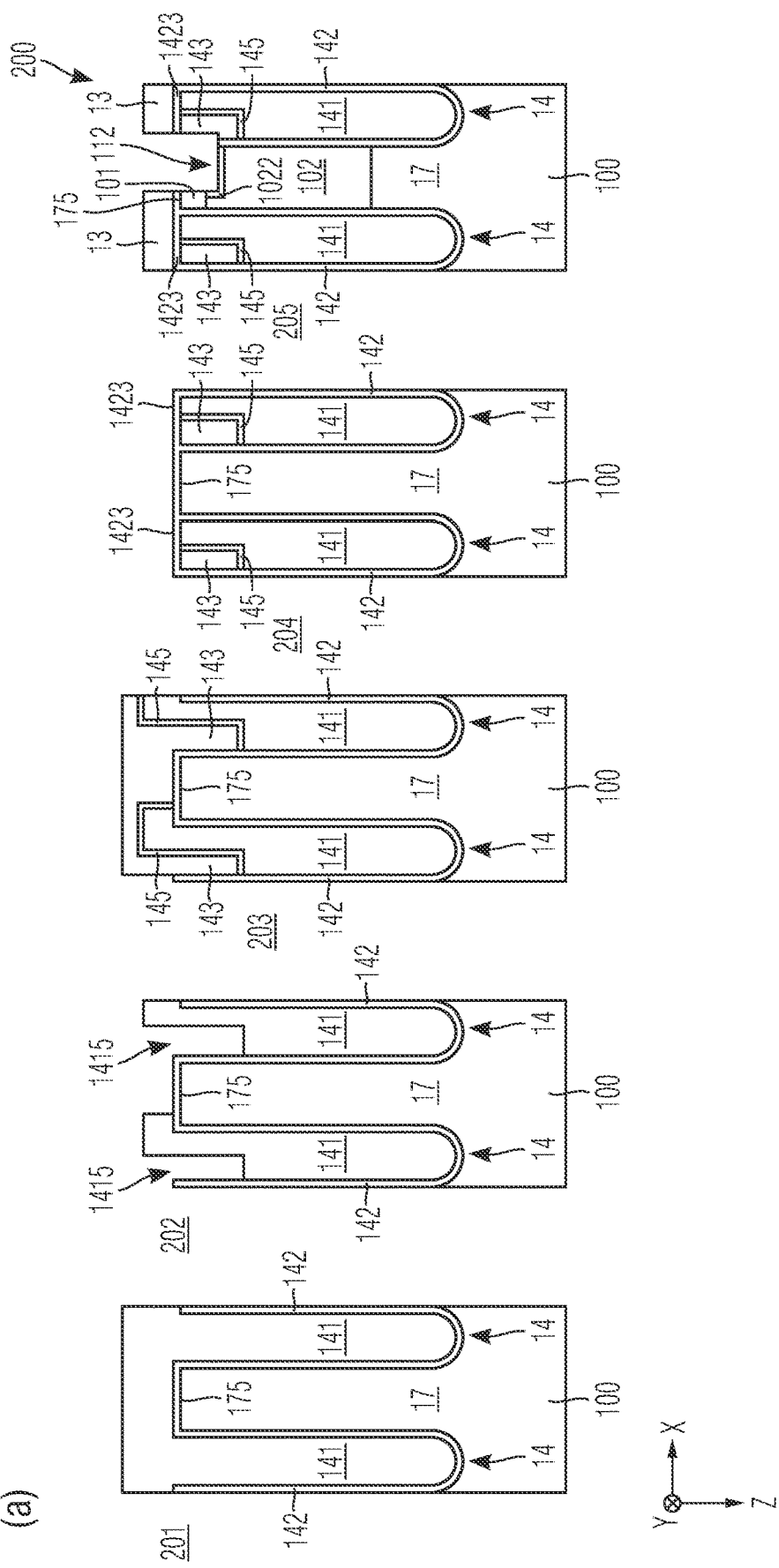

(b)

MESA CONTACT FOR MOS CONTROLLED POWER SEMICONDUCTOR DEVICE AND METHOD OF PRODUCING A POWER SEMICONDUCTOR DEVICE

TECHNICAL FIELD

This specification refers to embodiments of a power semiconductor device and to embodiments of a method of producing a power semiconductor device. In particular, this specification is related to embodiments where a contact plug contacts a narrow mesa of the power semiconductor device.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a forward load current along a load current path between two load terminals of the device.

Further, in case of a controllable power semiconductor device, e.g., a transistor, the load current path may be controlled by means of an insulated electrode, commonly referred to as gate electrode. For example, upon receiving a corresponding control signal from, e.g., a driver unit, the control electrode may set the power semiconductor device in one of a forward conducting state and a blocking state.

Often, the gate electrode may be included within a trench of the power semiconductor switch, wherein the trench may exhibit a stripe configuration.

Two adjacent trenches laterally confine a portion of the semiconductor body typically referred to as mesa or mesa portion. Such mesa is typically configured for providing a path of the forward load current, e.g., by including a source region and a body region.

In order to provide for a path of the forward load current, the mesa must be electrically contacted with one of the load terminals of the power semiconductor device. Such a contact may, for example, be established by means of a contact plug structure, according to which an electrically conductive material of a contact plug extends into a groove-like recess in a central portion of the mesa so as to there contact both the source region and the body region. Alternatively, the contact plug is arranged above and in contact with a surface of the mesa so as to there contact both the source region and the body region.

For diverse reasons, it may be desirable to keep the width of such mesa, i.e., the distance between opposite trench sidewalls of the adjacent trenches laterally confining the mesa, small.

However, as the mesa width becomes smaller, it also becomes more difficult to reliably contact the same based on a contact plug structure.

SUMMARY

According to an embodiment, a power semiconductor device comprises: a semiconductor body comprising a first surface and a mesa portion, wherein the mesa portion comprises a surface part of the first surface and a body region; at least two trenches extending from the first surface into the semiconductor body along a vertical direction, wherein each of the two trenches comprises a trench electrode and a trench insulator insulating the trench electrode from the semiconductor body, and wherein the mesa portion is laterally confined by the two trenches in a first vertical cross-section along a first lateral direction; a contact plug in contact with the body region, wherein the contact plug and the trench electrode of a first trench of the two trenches laterally overlap at least partially in the first vertical cross-section; and a protection structure. The protection structure has a portion arranged within the first trench. The protection structure is arranged between the contact plug and the trench electrode of the first trench. The protection structure may be an electrically insulation structure or a protective device structure. For example, the protection structure extends deeper along the vertical direction than both the surface part of the mesa portion and a trench cover of a second trench of the two trenches. In another embodiment, the protection structure is arranged at or above the surface part of the mesa portion and/or at or above the trench cover of the second trench.

According to another embodiment, a method of producing a power semiconductor device comprises forming: a semiconductor body comprising a first surface and a mesa portion, wherein the mesa portion comprises a surface part of the first surface and a body region; at least two trenches extending from the first surface into the semiconductor body along a vertical direction, wherein each of the two trenches comprises a trench electrode and a trench insulator insulating the trench electrode from the semiconductor body, and wherein the mesa portion is laterally confined by the two trenches in a first vertical cross-section along a first lateral direction; a contact plug in contact with the body region, wherein the contact plug and the trench electrode of a first trench of the two trenches laterally overlap at least partially in the first vertical cross-section; and a protection structure. The protection structure has a portion arranged within the first trench. The protection structure is arranged between the contact plug and the trench electrode of the first trench. The protection structure may be an electrically insulation structure or a protective device structure. For example, the protection structure extends deeper along the vertical direction than both the surface part of the mesa portion and a trench cover of a second trench of the two trenches. In another embodiment, the protection structure is arranged at or above the surface part of the mesa portion and/or at or above the trench cover of the second trench.

In the following, it is referred to both the method and the semiconductor device, if not stated otherwise.

In accordance with embodiments presented herein, the protection structure enables the usage of a mesa-neighboring trench shared contact for a device, such an IGBT, where a contact scheme is employed according to which the electrode of the trench adjacent to the mesa portion may not be connected to the emitter potential of the device, but to another potential, such as gate potential. In other words, a mesa contact window (e.g., of an IGBT mesa or a diode mesa) has an overlap at least in some locations with the neighboring trench having a trench electrode which may not be at the emitter/source potential. E.g., the mesa connecting electrode, i.e., the contact plug, is electrically insulated from the mesa-neighboring trench electrode, e.g., at least inside the locations in which the mesa contacts have an overlap with the neighboring trench, wherein the electrical insulation may be established at least based on the protection structure. Furthermore, since a lateral overlap with the contact plug and the trench electrode is possible, the width of the mesa portion may be comparably small. In addition, a cheap metallization material, such as a mixture of aluminum, silicon and copper (AlSiCu), may be employed for forming the contact plug.

In the following, some exemplary embodiments are described. The features of these embodiments may be combined with each other to form yet further embodiment, if not explicitly stated otherwise.

In an embodiment, the power semiconductor device has a first load terminal at the first side and a second load terminal, wherein the semiconductor body is configured for conducting a load current between the first load terminal and the second load terminal and wherein the trenches and the contact plug are arranged near or at the first side. One or both of the two trenches may be control trenches and its/their trench electrode(s) can be a control electrode insulated from the first load terminal and configured to control the load current in the mesa portion. For example, the power semiconductor device is an IGBT (or an RC IGBT) or a MOSFET. The first load terminal may hence be an emitter terminal (also referred to as source terminal) and the second load terminal may be a collector terminal (also referred to as drain terminal). A further terminal, such as a control/gate terminal, may be arranged at the first side. The gate terminal may be electrically connected to the control trench electrode(s). The second load terminal may be arranged at a second side, which may be a backside.

In an embodiment of the power semiconductor device, the first trench and the second trench may be similarly or even identically configured. For example, both the first trench and the second trench exhibit the same trench depth (along the vertical direction) and/or the same trench width (along the first lateral direction). Also the second trench may house a trench electrode. The trench electrode of the first and second trenches may have the same electrical potential or exhibit electrical potentials different from each other.

In an embodiment of the power semiconductor device, the first trench is a control trench and its trench electrode is a control electrode insulated from the first load terminal (e.g., an emitter terminal) of the device and configured to control the load current in the mesa portion. The second trench may also be control trench. Or, the second trench is a source trench and its trench electrode is a source electrode electrically connected to the first load terminal.

As the trench electrode of the first trench may be electrically insulated from the contact plug, the trench electrode can be connected to any other potential or, be electrically floating. E.g., the trench electrode may be connected to one of a gate potential of a gate terminal, to another gate potential or to a measurement potential. E.g., the trench electrode may also function as a gate resistor, or as a temperature resistor.

Further, it shall be understood that the power semiconductor device may include more than only two trenches and, according, more than only one mesa portion. For example, the power semiconductor device exhibits an active region where a plurality (e.g., more than 100 or more than 1000) of power unit cells are formed based on a plurality of trenches and mesa portions arranged adjacent to each other, e.g., along the first lateral direction. The trenches and mesa may be arranged in accordance with a pattern, e.g., according to which each power unit cell includes one or more control trenches, zero or more source trenches, zero or more second control trenches, zero or more floating trenches, one or more IGBT mesa portions, zero or more diode mesa portions, zero or more dummy mesa portions arranged in a specific sequence along the first lateral direction. The notions used in this paragraph will be described further below. In one, in some or in each of the power unit cells, the exemplary provisions regarding the protection structure described herein may be fulfilled for at least one mesa portion and at least one first trench of the respective power unit cell.

Also, a further protection structure may be provided for the second trench. Hence, everything what is described with respect to the protection structure and the first trench may equally apply to an optional further protection structure and the second trench.

In an embodiment of the power semiconductor device, the protection structure extends deeper along the vertical direction than a trench cover of the first trench. For example, the protection structure may hence be arranged below, e.g., entirely below the trench cover of the first trench. For example, both the trench cover of the first trench and the trench cover of the second trench are arranged between the trench electrode of the respective trench and the first load terminal (e.g., an emitter terminal) of the device.

In an embodiment of the power semiconductor device, the contact plug projects into the first trench. Thereby, said lateral overlap with the trench electrode of the first trench may be established.

In an embodiment of the power semiconductor device, the trench electrode of the first trench may exhibit a width in the first lateral direction that varies along the vertical direction. For example, in a portion of the first trench into which the protection structure and/or the contact plug extend(s), the width of the trench electrode may be smaller as compared to another portion of the first trench. For example, the portion of the first trench into which the protection structure and/or the contact plug extend(s) and where the trench electrode width may be reduced is a top portion of the first trench.

In an embodiment of the power semiconductor device, the width of the mesa portion in the first lateral direction is at most 1.5 µm, or at most 600 nm, or at most 200 nm.

In an embodiment of the power semiconductor device, the trench insulator forms trench sidewalls (e.g., extending, at least partially, perpendicular to both said vertical cross-section and the first lateral direction) and a trench bottom (e.g., extending, at least partially, perpendicular to said vertical cross-section and in parallel to the first lateral direction). The trench cover may be formed also by the same material as the trench insulator and/or by another insulation structure and/or another material.

In an embodiment of the power semiconductor device, the contact plug is arranged entirely above the trench electrode of the first trench.

In an embodiment of the power semiconductor device, the mesa portion comprises a source region, and the contact plug is also in contact with the source region. The source region may be isolated from a drift region by the body region. For example, the trench electrode of the first trench is configured to induce an inversion channel in the body region upon receiving a corresponding control signal, e.g., from a driver unit. The source region and the drift region may both be regions of the first conductivity type, whereas the body region may be a region of the second conductivity type complementary to the first conductivity type.

In an embodiment of the power semiconductor device, the contact plug extends further along the vertical direction than the source region. Here, it shall be understood that the contact plug may either be configured as flat contact that terminates substantially at the surface part of the mesa portion or the contact plug may extend below the surface part of the mesa portion.

In an embodiment of the power semiconductor device, the protection structure comprises a dielectric layer or is a dielectric layer. E.g., such dielectric layer may be configured such that the electrical potential of the trench electrode may be different as compared to the electrical potential of the contact plug. For example, the contact plug may be electrically insulated from the trench electrode based at least on the protection structure (e.g., in the form of said dielectric layer).

In an embodiment of the power semiconductor device, the protection structure is a protective device structure and forms a part of an npn-structure, a pnp-structure, back-to-back Zener diodes, a Schottky-diode-structure or a punch-through-structure. For example, based on the protective device structure, it can be ensured that a voltage between the contact plug and the trench electrode is limited to a maximal voltage defined at least partially by the protective device structure. Said exemplary structures (npn-structure, pnp-structure, back-to-back Zener diodes, Schottky-diode-structure, punch-through-structure) may additionally be formed by the contact plug and/or the trench electrode itself. For example, if the trench electrode of the first trench is formed by a p-type poly-crystalline semiconductor material, a pnp-structure may be used for formation of back-to-back Zener diodes or a punch-through-structure. Materials used for forming the protective device structure may include one or more of a poly-crystalline semiconductor material and a thin dielectric material.

In an embodiment of the power semiconductor device, the contact plug includes a first side surface, a second side surface and a bottom surface, wherein the first side surface adjoins the first trench, the bottom surface adjoins the body region and the second side surface adjoins the source region. The two side surfaces may be arranged in a plane substantially in parallel to both the vertical direction and the second lateral direction (which may be perpendicular to the first lateral direction). The bottom surface may be arranged in a plane substantially in parallel to both the second lateral direction and the first lateral direction. For example, the contact plug hence establishes a contact with each of the body region, the source region and an inner portion of the first trench without, however, being in contact with the trench electrode of the first trench.

In an embodiment of the power semiconductor device, the contact plug laterally overlaps with the entire trench electrode of the first trench in the first vertical cross-section and wherein the contact plug only partially laterally overlaps with the mesa portion in the first vertical cross-section. E.g., in such embodiment, the contact plug may additional establish contact with a body region of another mesa portion adjacent to the first trench.

In an embodiment, the power semiconductor device comprises at least two first trenches, wherein the contact plug laterally overlaps with the at least two first trenches in the vertical cross-section. For example, no further trench may be arranged between said two first trenches (e.g., only a part of the semiconductor body, for instance a mesa portion, may be laterally arranged between the two first trenches). Alternatively, at least one further trench (e.g., a second trench) may be arranged between the two first trenches.

In some embodiments, the power semiconductor device may comprise a plurality of mesa portions, a plurality of first trenches and a plurality of second trenches, wherein each of the mesa portions is laterally confined by two of the trenches (e.g., by two first trenches, or by one first trench and one second trench) in the first vertical cross-section, wherein the contact plug laterally overlaps entirely with the first trenches in the first vertical cross-section.

In an embodiment of the power semiconductor device, the contact plug is laterally spaced apart from the second trench in the vertical cross-section along the first lateral direction. The contact plug does for example not laterally overlap with the other of the two trenches that laterally confine the mesa portion.

In an embodiment of the power semiconductor device, the contact plug adjoins a part of a trench sidewall of the first trench. For example, the contact plug may extend, from the mesa portion into the first trench, by crossing above a lower a part of the trench sidewall.

In an embodiment of the power semiconductor device, a part of the trench insulator of the first trench is located between the contact plug and the trench electrode of the first trench. For example, the contact plug may hence be insulated from the trench electrode based on at least one of the trench insulator and the protection structure.

In an embodiment of the power semiconductor device, a lateral distance in the first lateral direction between the contact plug and the trench insulator of the other trench is at most 1 µm and/or at least 150 nm. In some examples, said lateral distance is at most 250 nm, e.g., at most 200 nm. As described above, the herein proposed configuration of the contact plug and the trenches allows for designing the mesa portion with a comparatively small mesa width while at the same time being able to reliably contact the mesa portion based on the contact plug.

In an embodiment of the power semiconductor device, the body region includes a contact portion with a locally increased dopant concentration, wherein the contact plug adjoins said contact portion of the body region. Further, the contact portion may adjoin a portion of the trench insulator, wherein said portion of the trench insulator may also contacted by the contact plug. Further, the contact portion may be spaced apart from the trench insulator of the second trench by a distance in the first lateral direction amounting to at least 20% of the width of the mesa portion in the first lateral direction. If the source region is also present in the mesa portion, it may hence be ensured that the source region adjoins into a portion of the body region different from its contact portion, i.e., into a portion that does not exhibit the locally increased dopant concentration but the smaller regular dopant concentration of the body region, such that induction of an inversion channel in the body region is possible for load current conduction.

In an embodiment of the power semiconductor device, the first trench is a multi-trench-electrode trench. For example, based on the protection structure and/or an additional insulation structure in the first trench, the first trench may be equipped with more than on trench electrode, e.g., two or more trench electrodes, wherein the two or more trench electrodes may be spatially separated from each other along at least one of the first lateral direction, the second lateral direction and the vertical direction. Further, the two or more trench electrodes may exhibit the same electrical potential or electrical potentials that differ from each other, e.g., two different gate potentials, or one gate potential and one floating potential, or one gate potential and one source potential, to give a few examples.

In an embodiment, the power semiconductor device further comprises a trench contact plug arranged in electrical contact with the trench electrode of the first trench, wherein the first trench is laterally structured along the second lateral direction such that both the protection structure and the contact plug are laterally spaced apart from the trench contact plug along the second lateral direction. For example, the trench contact plug establishes an electrical connection between the trench electrode of the first trench and a gate runner structure or a gate finger structure of the device, wherein gate runner structure or a gate finger structure are electrically connected to the gate/control terminal of the device and extend into the edge termination region and/or the active region of the device. For example, the trench electrode of the first trench may be a control trench electrode that is electrically connected to a gate potential, e.g., based on the trench contact plug and/or the gate runner/finger structure.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings.

DETAILED DESCRIPTION

Figure 1A:
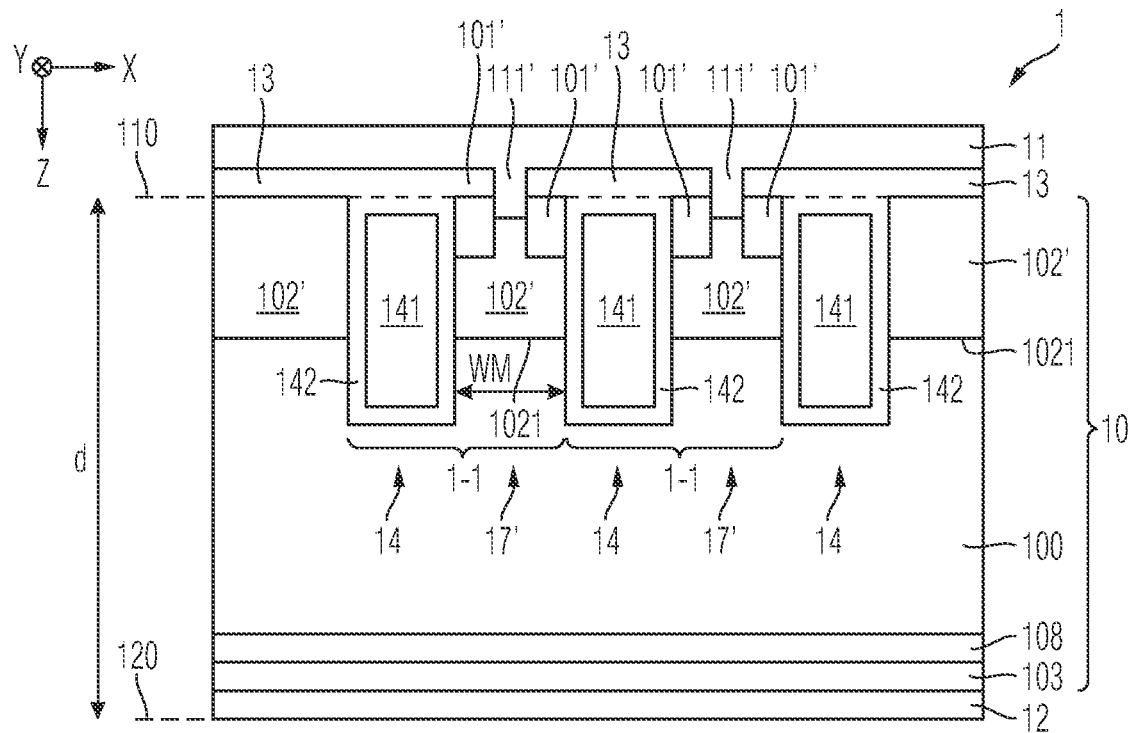
FIGS. 1A-B both schematically and exemplarily illustrate a section of a vertical cross-section of a power semiconductor device.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device, wherein "low ohmic" may mean that the characteristics of the respective contact are essentially not influenced by the ohmic resistance. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor device, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor unit cells, such as a monolithically integrated diode cell, a derivative of a monolithically integrated diode cell (e.g., a monolithically integrated cell of two anti-serially connected diodes), a monolithically integrated transistor cell, e.g., a monolithically integrated MOSFET or IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more, depending on the respective application.

For example, the term "power semiconductor device" as used in this specification is not directed to logic semiconductor devices that are used for, e.g., storing data, computing data and/or other types of semiconductor based data processing.

The present specification in particular relates to power semiconductor devices embodied as respective MOSFETs or IGBTs, i.e., unipolar or bipolar power semiconductor transistors that are controlled by insulated electrodes (gates), or a derivate thereof.

For example, the power semiconductor device described below may be a single semiconductor chip exhibiting a stripe cell configuration (or a cellular/needle cell configuration) and can be configured to be employed as a power component in a low-, medium- and/or high voltage application. However, the herein proposed technical teaching may also be applied to a power semiconductor device having a cellular/needle cell configuration.

Figure 1B:
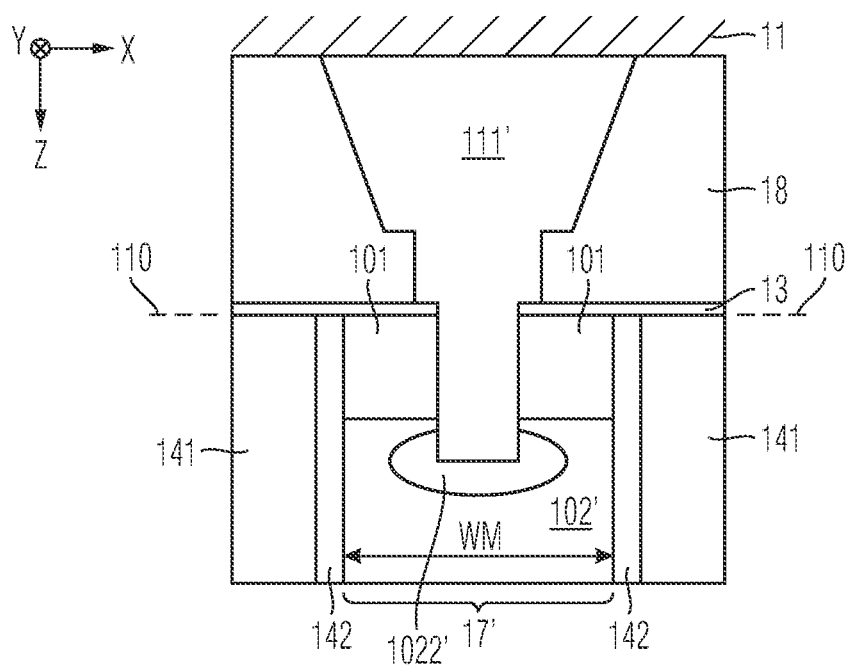

FIGS. 1A-B schematically and exemplarily illustrate a section of a vertical cross-section of a power semiconductor device 1. The power semiconductor device 1 can be based on/implemented within a single-chip.

Figure 2A:
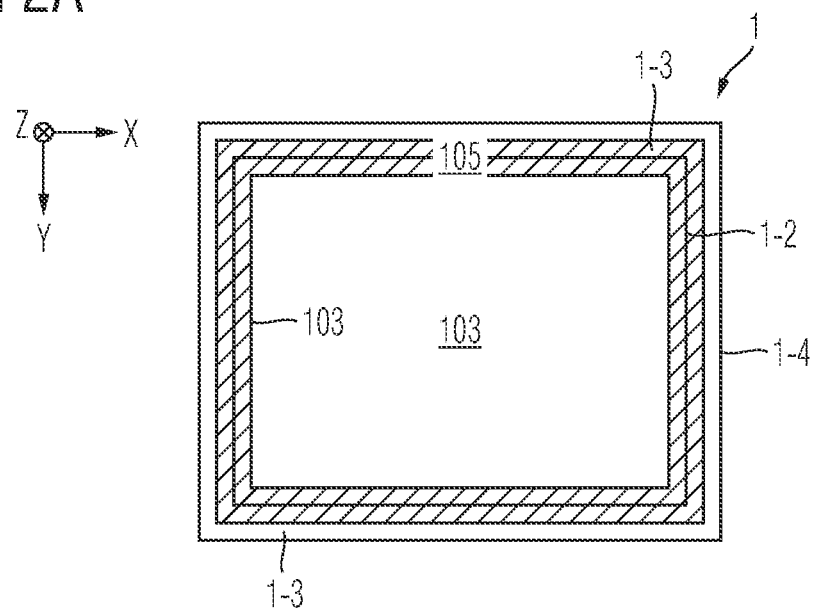
FIG. 2A-B both schematically and exemplarily illustrate a section of a horizontal projection of a power semiconductor device in accordance with some embodiments.
Figure 2B:
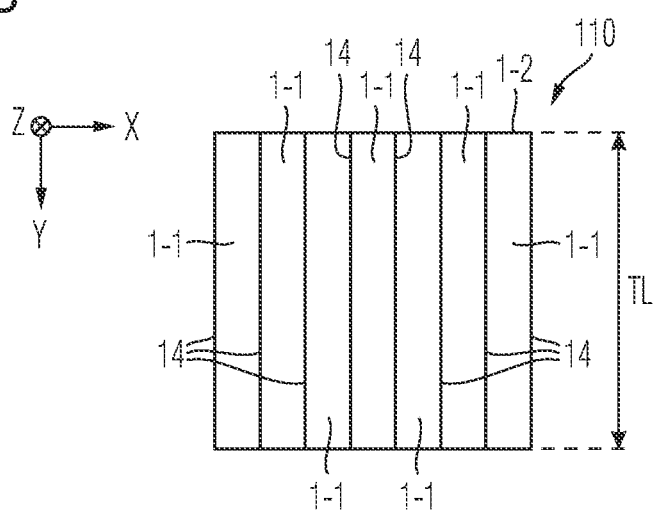

Referring to FIG. 2A, the power semiconductor device 1 can have an active region 1-2 with a number of power unit cells 1-1, which are arranged in accordance with a stripe cell configuration as schematically illustrated in FIG. 2B. Accordingly, an extension in the second lateral direction Y of each power unit cell 1-1 may amount to a multiple of the extension in the first lateral direction X. However, as indicated above, the herein proposed technical teaching may also be applied to a power semiconductor device having a cellular cell configuration (also referred to as cellular cell configuration or columnar cell configuration) where the extension in the second lateral direction Y of each power unit cell can be in a similar range as the extension in the first lateral direction X.

An edge termination region 1-3 of the power semiconductor device 1 may surround the active region 1-2. Hence, the edge termination region 1-3 can be arranged external of the active region 1-2 and/or can adjoin the active region 1-2. The edge termination region 1-3 is laterally terminated by an edge 1-4. The edge 1-4 may form the chip edge of the power semiconductor device 1.

As used herein, the terms "edge termination region" and "active region" are both associated with the respective technical meaning the skilled person typically associates therewith in the context of power semiconductor devices. That is, the active region 1-2 is primarily configured for load current conduction and (if applicable) switching purposes, whereas the edge termination region 1-3 primarily fulfills functions regarding reliable blocking capabilities, appropriate guidance of the electric field, sometimes also charge carrier drainage functions, and/or further functions regarding protection and proper termination of the active region 1-2.

Referring to FIG. 1A again, the power semiconductor device 1 has a semiconductor body 10 having a first side 110, which may be a frontside, e.g., formed by a semiconductor body surface (and is hence herein also referred to as first surface 110), and a second side 120, which may be a backside. The frontside 110 and the backside 120 may vertically terminate the semiconductor body 10. That is, the semiconductor body 10 can have a total thickness d along the vertical direction Z between the frontside 110 and the backside 120. In the lateral directions, the semiconductor body 10 may be terminated by the edge 1-4 (not illustrated in FIG. 1A). Furthermore, both the frontside 110 and the backside 120 may extend laterally along both the first lateral direction X and the second lateral direction Y. For example, both the frontside 110 and the backside 120 may form a respective horizontal surface of the semiconductor body 10. The thickness d of the semiconductor body 10 may be the distance between the frontside 110 and the backside 120 along the vertical direction Z in the active region 1-2, e.g., measured at a center of the active region 1-2.

The semiconductor body 10 forms a part of both the active region 1-2 and the edge termination region 1-3. E.g., the below described possible configurations of the power unit cell(s) 1-1 are primarily implemented in the semiconductor body 10. The semiconductor body 10 is, in the active region 1-2, configured to conduct a forward load current between a first load terminal 11 and a second load terminal 12.

For example, a first load terminal 11 is arranged at the semiconductor body frontside 110 and a second load terminal 12 is arranged at the semiconductor body backside 120. E.g., the first load terminal 11 comprises a frontside metallization and/or the second load terminal 12 comprises a backside metallization. For example, the first load terminal 11 is an emitter terminal and the second load terminal 12 is a collector terminal. At the frontside 110, the semiconductor body 10 may adjoin the frontside metallization. At the backside 120, the semiconductor body 10 may adjoin the backside metallization.

In an embodiment, the first load terminal 11 (e.g., said frontside metallization) laterally overlaps, that is, along the first lateral direction X and/or the second lateral direction Y and/or combinations thereof, with the active region 1-2. It shall be noted that the first load terminal 11 may be laterally structured, e.g., so as to establish local contacts with the semiconductor body 10 at the frontside 110. E.g., as exemplary illustrated in FIG. 1A, said local contacts can be established by means of a contact plug 111' penetrating a first insulation layer 13, e.g., according to which an electrically conductive material extends into a groove-like recess in a central portion of a mesa portion 17' so as to there contact both a source region 101' and a body region 102'.

Analogously, in an embodiment, the second load terminal 12 (e.g., said backside metallization) laterally overlaps, that is, along the first lateral direction X and/or the second lateral direction Y and/or combinations thereof, with the active region 1-2. It shall be noted that the second load terminal 12 is typically not structured but formed homogenously and monolithically at the semiconductor body backside 120, e.g., so as to establish a laterally homogenous contact with the semiconductor body 10 at the backside 120. Such homogenous structure may also be implemented in regions where the second load terminal 12 laterally overlaps with the edge termination region 1-3.

For example, the lateral boundary of the active region 1-2 is defined by the lateral boundary of the outermost power unit cell(s) 1-1. Hence, the lateral boundary of the active region 1-2 may be defined at the frontside 110. This lateral boundary can be defined by an outermost source region(s) 101' (cf. explanation in more detail below). For example, all functional elements to enable conduction of the load current are present in a vertical projection of the active region 1-2 of the power semiconductor device 1, e.g., including at least the first load terminal 11 (e.g., a frontside metal contact thereof, e.g., one or more of the contact plugs 111'), the source region(s) 101', the body region 102', a drift region 100, a backside emitter 103, and the second load terminal 12 (e.g., a backside metal thereof).

In an embodiment, the edge termination region 1-3 and the active region 1-2 may be symmetrically arranged to one another, e.g., with respect to a central vertical axis of the power semiconductor device 1, as it is exemplarily illustrated in FIG. 2A.

Furthermore, the lateral transition between the active region 1-2 and the edge termination region 1-3 may extend exclusively along the vertical direction Z, in accordance with an embodiment. As explained above, the lateral boundary of the active region 1-2 may be defined at the frontside 110, and a vertical projection along the vertical direction Z of such defined lateral boundary may hence be observed at the backside 120.

Returning to FIG. 1A, an exemplary configuration of one of the power unit cells 1-1 shall be described. Each power unit cell 1-1 of the power semiconductor device 1 may be equally configured. For example, each power unit cell 1-1 includes at least one trench 14 and at least one mesa portion 17'. In other embodiments, each power unit cell 1-1 may include more than one trench 14 and more than one mesa portion 17', wherein the trenches 14 may be identically or differently configured, and wherein the mesa portions 17' may be identically or differently configured.

The body region 102' of the second conductivity type is included in the semiconductor body 10. The body region 102' may be arranged in electrical contact with the first load terminal 11, e.g., by means of the contact plug 111'. In each power unit cell 1-1, there may be furthermore provided at least one source region 101' of the first conductivity type arranged in electrical contact with the first load terminal 11, e.g., also by means of the contact plug 111'.

A major part of the semiconductor body 10 is formed as the drift region 100 of the first conductivity type, which partially adjoins the body region 102' and forms a pn-junction 1021 therewith.

The body region 102' may be arranged between the source regions 101' and/or the first surface 110 and the drift region 100 and may isolate the source regions 101' from the drift region 100.

Each power unit cell 1-1 is furthermore associated with a trench electrode 141. The trench electrodes 141 may be arranged in a respective trench 14 and can be isolated from the semiconductor body 10 by means of a respective trench insulator 142. Upon receipt of a corresponding control signal, e.g., provided by a non-illustrated gate driver unit, each trench electrode 141 can induce an inversion channel in a section of the body region 102' adjacent to the respective trench electrode 141. Thus, each of the number of power unit cells 1-1 is configured for conducting at least a portion of the load current between the first load terminal 11 and the second load terminal 12.

In the above described basic configuration of the power unit cells 1-1 of a power semiconductor device (e.g., a MOSFET, an IGBT or RC-IGBT), the used terminology (e.g., the term "power unit cells") is within the scope of the technical meaning the skilled person typically associates therewith.

Furthermore, in addition to the configuration as control electrodes, other trench electrodes 141 could be provided in some or each of the power unit cells 1-1 that fulfill another function, such as dummy trench electrodes, source trench electrodes, floating trench electrodes and the like.

As illustrated in FIG. 1A, the body region 102' extends from the frontside 110 along the vertical direction Z until it adjoins with the drift region 100. The drift region 100, which may laterally overlap with the entire lateral area occupied by the number of power unit cells 1-1, extends for a longer range along the vertical direction Z, until it adjoins in a field stop layer 108 (also known as buffer layer), wherein the field stop layer 108 is also of the first conductivity type, but exhibits a higher dopant dose as compared to the drift region 100. The field stop layer 108 is typically of significantly smaller thickness than the drift region 100. It also extends along the vertical direction Z until adjoining the backside emitter 103. The backside emitter region 103 is arranged in electrical contact with the second load terminal 12, as illustrated in FIG. 1A.

In case of an IGBT, the backside emitter region 103 acts as an emitter of the second conductivity type. Furthermore, if the power semiconductor device 1 is implemented as an RC IGBT, the backside emitter region 103 may comprise some sections of the first conductivity type, which exhibit a rather high dopant concentration (e.g., higher as compared to the dopant concentration of the drift region 100), e.g., in the range of $10^{16}$ cm$^{-3}$ to $10^{20}$ cm$^{-3}$. In case of a MOSFET, the backside emitter region 103 acts as an emitter of the first conductivity type.

With respect to the lateral extension of the backside emitter 103, in an embodiment, the emitter region 103 may laterally overlap with at least 80%, or at least 90% of a lateral area occupied by the number of power unit cells 1-1 in the active region 1-2. In an embodiment, the emitter region 103 may, as the drift region 100, laterally overlap with the entire (100% of the) lateral area occupied by the number of power unit cells 1-1 in the active region 1-2. In other embodiments, as illustrated in FIG. 2A, the emitter region 103 laterally overlaps with less than 100% of the lateral area occupied by the number of power unit cells 1-1 in the active region 1-2, e.g., with around 80% to 90%.

An outermost portion of the active region 1-2 at the backside 120 arranged, in such case, laterally "between" (cf. explanation below) the edge termination region 1-3 and the backside emitter region 103 (herein also referred to as "emitter region 103" or "backside emitter 103") may be occupied by a termination frame region 105 formed in the semiconductor body 10 at the backside 120.

The termination frame region 105 can be of the second conductivity type (e.g., p-type) and may be arranged in electrical contact with the second load terminal 12. The termination frame region 105 is not illustrated in FIG. 1A, but it may have a thickness along the vertical direction Z approximately as great as the thickness of the backside emitter 103. The termination frame region 105 may not only extend into the active region 1-2, but also into the edge termination region 1-3. The edge termination region 1-3 can extend to the chip edge 1-4. As explained above, depending on the lateral extension of the backside emitter 103, the termination frame region 105 may, at the backside 120, extend into either the active region 1-2 or the edge termination region 1-3, or into both the active region 1-2 and the edge termination region 1-3. However, in an embodiment, the percentage of the lateral area of the active region 1-2 at the backside 120 occupied by the termination frame region 105 amounts to at most 20%, or to at most 10%, in accordance with an embodiment.

Furthermore, the termination frame region 105 can exhibit a VLD (variation of the lateral doping) profile with a decreasing dopant concentration in the direction to the edge termination region 1-3 and/or a VLD profile with an increasing dopant concentration in the direction to the emitter region 103.

The termination frame region 105 is occasionally also referred to as HDR (High Dynamic Robustness) region and may be designed as an interface region between the backside emitter 103 and the semiconductor body portion in the edge termination region 1-3, e.g., so as to able to contribute to appropriate electrical field strengths in the semiconductor body 10 that are beneficial with regards to the robustness of the power semiconductor device 1.

It is emphasized that the power semiconductor device 1 may also be embodied as a MOSFET, with corresponding implications regarding the configuration of the semiconductor regions 103 and 108, or as a device deviated from a MOSFET configuration or an IGBT configuration.

The above described aspects of the power semiconductor device 1 relate to an exemplary basic configuration of the power semiconductor device 1. Embodiments described herein are related to a novel design regarding the contact between the first load terminal 11 and the mesa portions 17', and optionally also to the mesa configuration in terms of the source region 101' and the body region 102'. As in particular these aspects may be modified in accordance with the embodiments disclosed herein, in the subsequent description, the body region will be referred to with reference numeral 102, the source region with reference numeral 101, the mesa portion with reference numeral 17 and the contact plug with reference numeral 111, whereas the other reference numerals introduced above do not designate components that necessarily differ from those introduced with respect to FIGS. 1A-2B and are accordingly used in the same manner below. However, as will become apparent from the below description, the configuration of the trenches 14 may change as well as compared to the configuration illustrated in FIGS. 1A-B.

For diverse reasons, it may be desirable to keep the width WM of the mesa portion, i.e., the distance between opposite trench sidewalls of the adjacent trenches 14 laterally confining the mesa portion, small. However, as the mesa width WM becomes smaller, it also becomes more difficult to reliably contact the mesa portion 17 (e.g., the source region 101 and/or the body region 102) with a contact plug 111' in a manner as illustrated in FIGS. 1A-B. E.g., referring to FIG. 1B, the contact plug 111' extends through an insulation structure 13, 18 into a central section of the mesa portion 17' so as to contact both the source region 101' and a contact portion 1022' of the body region 102' in the mesa portion 17'. An inversion channel is induced in a portion of the body region 102' adjoining the trench insulators 142 below the source region 101. For this reason, it is typically desired that the contact portion 1022' of the body region 102' is laterally displaced from the trench insulator 142 of the trench 14 which includes the trench electrode 141 that induces said inversion channel. As the mesa width WM becomes smaller, this design goal may be difficult to achieve.

Figure 3:
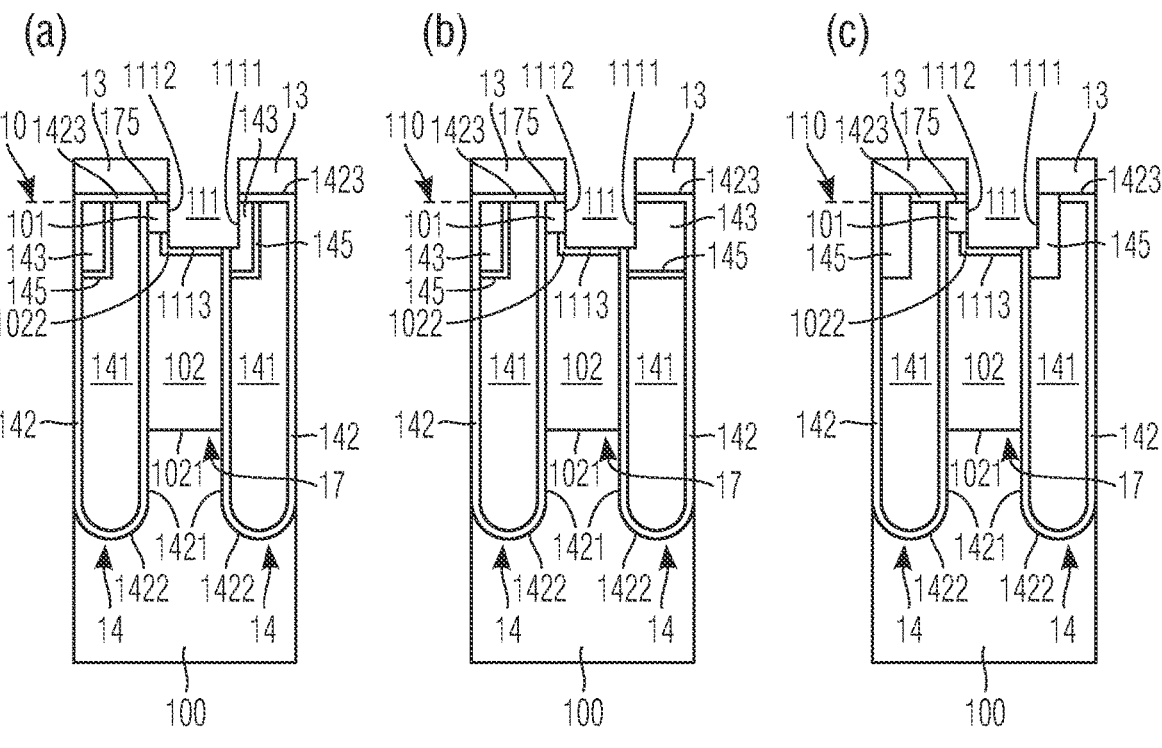
FIG. 3-5 each schematically and exemplarily illustrate a section of a vertical cross-section of a power semiconductor device in accordance with some embodiments.
Figure 3:
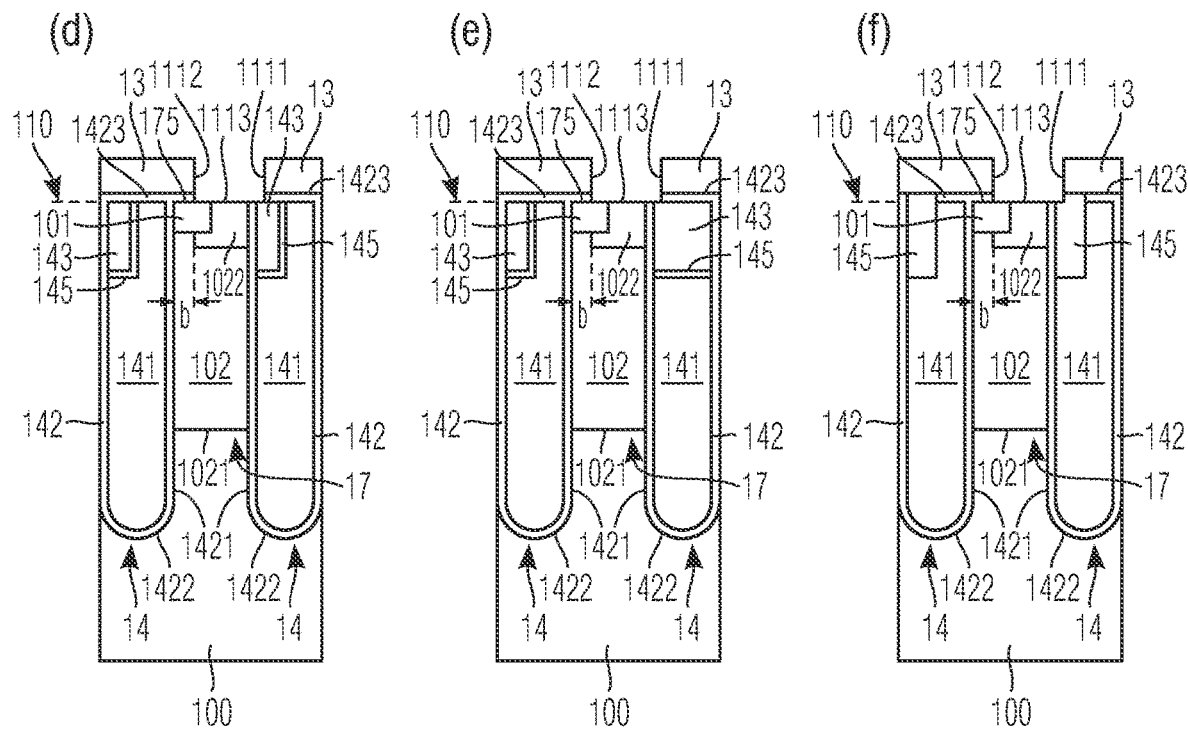

Each of variants (a)-(f) of FIG. 3 schematically and exemplarily illustrates a section of a vertical cross-section of the power semiconductor device 1 in accordance with one or more embodiments.

For example, the power semiconductor device 1 comprises: the semiconductor body 10 comprising the first surface 110 and the mesa portion 17. The mesa portion 17 comprises a surface part 175 of the first surface 110 and the body region 102. At least two trenches 14 extend from the first surface 110 into the semiconductor body 10 along the vertical direction Z, wherein each of the two trenches 14 comprises the trench electrode 141 and the trench insulator 142 insulating the trench electrode 141 from the semiconductor body 10. The mesa portion 17 is laterally confined by the two trenches 14 in a first vertical cross-section along the first lateral direction X. A contact plug 111 is in contact with the body region 102. The contact plug 111 and the trench electrode 141 of a first trench (14) of the two trenches 14 (herein, the first trench 14 may be the trench 14 on the right side of the mesa portion 17 illustrated in FIG. 3) laterally overlap at least partially in the first vertical cross-section. The power semiconductor device 1 has a protection structure 145. The protection structure has a portion arranged within the first trench 14. The protection structure 145 is arranged between the contact plug 111 and the trench electrode 141 of the first trench 14. The protection 145 structure is an electrically insulation structure or a protective device structure (examples of which being described further below). For example, the protection structure 145 extends deeper along the vertical direction Z than both the surface part 175 of the mesa portion 17 and a trench cover 1423 of a second trench (14) of the two trenches (herein, the second trench 14 may be the trench 14 on the left side of the mesa portion 17 illustrated in FIG. 3).

In the following, it will be referred to each of variants (a) to (f) of FIG. 3. In accordance with each variant (a) to (f) of FIG. 3, the body region 102 forms a pn-junction 1021 with a region of the first conductivity type (e.g., a section of the drift region 100) in the mesa portion 17.

Further, both trenches 14 laterally confining the mesa portion 17 may be control trenches 14 with the trench electrodes 141 being electrically connected to a (non-illustrated) gate/control terminal of the device 1; i.e., the trench electrodes 141 of said two trenches 14 may be electrically insulated from the first load terminal 11.

Further, regarding both trenches 14, the trench insulator may form, at least partially, trench sidewalls 1421 and/or a trench bottom 1422 of the respective trench 14. A trench cover 1423 of the respective trench 14 may be formed by the same material as the trench insulator and/or by another insulation structure and/or may comprise a different material than the trench insulator.

Further, the mesa portion 17 may comprises the source region 101, and the contact plug 111 may also be in contact with the source region 101. The source region 101 may be isolated from the drift region 100 by the body region 102. For example, the trench electrode 141 of the first trench 14 is configured to induce an inversion channel in the body region 102 upon receiving a corresponding control signal, e.g., from said driver unit.

Further, the body region 102 may include a contact portion 1022 with a locally increased dopant concentration, wherein the contact plug 111 adjoins said contact portion 1022. Further, the contact portion 1022 may adjoin a portion of the trench insulator 142, wherein said portion of the trench insulator 142 may also contacted by the contact plug 111. Further, the contact portion 1022 may be spaced apart from the trench insulator 142 of the second trench 142 by a distance b in the first lateral direction amounting to at least 20% of the width of the mesa portion 17 in the first lateral direction X. If the source region 101 is also present in the mesa portion 17, it may hence be ensured that the source region 101 adjoins into a portion of the body region 102 different from its contact portion 1022, i.e., into a portion that does not exhibit the locally increased dopant concentration but the smaller regular dopant concentration of the body region 102, such that induction of an inversion channel in the body region 102 is possible for load current conduction.

Likewise, the contact plug 111 may be laterally displaced from the second trench 14 in the vertical cross-section along the first lateral direction X. Hence, in an embodiment, the contact plug 111 lateral overlaps with only one of the two trenches 14 laterally confining the mesa portion 17.

Further, in an embodiment, the contact plug 111 includes a first side surface 1111, a second side surface 1112 and a bottom surface 1113. The first side surface 1111 may adjoin the first trench 14 (cf. variants (a)-(c)), the bottom surface 1113 may adjoin the body region 102 (e.g., its contact portion 1022) and the second side surface 1112 may adjoin the source region 101 (cf. variants (a)-(c)). The two side surfaces 1111, 1112 may be arranged in a plane substantially in parallel to both the vertical direction Z and the second lateral direction Y. The bottom surface 1113 may be arranged in a plane substantially in parallel to both the second lateral direction Y and the first lateral direction X. For example, the contact plug 111 may hence establish a contact with (i.e., adjoin) each of the body region 102 (e.g., its contact portion 1022), the source region 101 and, optionally, an inner portion of the first trench 14 without, however, being in contact with the trench electrode 141 of the first trench 14.

Further, as indicated above, the contact plug 111 may be laterally spaced apart from the second trench 14 in the vertical cross-section along the first lateral direction X. E.g., a lateral boundary of the contact plug 111 may be defined by the first insulation layer 13 that is arranged above the trench cover 1423 of the second trench 14.

Further, a part of the trench insulator 142 of the first trench 14 may be located between the contact plug 111 and the trench electrode 141 of the first trench 14. Hence, the trench insulator may contribute in electrically insulating the contact plug 111 from the trench electrode 141 of the first trench 14.

Now regarding variants (a)-(c) of FIG. 3, the contact plug may extend deeper along the vertical direction Z than both the surface part 175 of the mesa portion 17 and the trench cover 1423 of the second trench 14 of the two trenches 14. The contact plug 111 may even extend further along the vertical direction Z than the source region 101.

Still regarding variants (a)-(c) of FIG. 3, the contact plug 111 may adjoin a part of the trench sidewall 1421 of the first trench 14. A part of the trench insulator 142, namely a part of the trench sidewall 1421 of the first trench 14 can hence be located between the contact plug 111 and the trench electrode 141 of the first trench 14. For example, a portion of the trench sidewall 1421 may hence laterally overlap with a portion of the contact plug 111. Both said portion of the trench sidewall 1421 and said portion of the contact plug 111 (which laterally overlap with each other) may be arranged below the surface part 175 (cf. variants (a)-(c)). Or, regarding variants (d)-(f), the contact plug 111 may be arranged entirely above the surface part 175, such that also said portion of the portion contact plug 111 forming the lateral overlap with the portion of the trench sidewall 1421 is arranged above the surface part 175.

Regarding variants (d)-(f), the contact plug 111 may be configured as a flat contact plug that terminates at the surface part 175. The surface part may in these variants be formed at least by the source region 101 and the contact portion 1022 of the body region 102.

The protection structure 145 can have one of multiple possible configurations. Generally, the protection structure 145 may be configured to contribute in electrically insulating the contact plug 111 from the trench electrode 141 of the first trench 14, wherein said trench electrode 141 may be the control (gate) electrode. Thus, the electrical potential of the contact plug 111 and the electrical potential of the trench electrode 141 may be different from each other. To this end, the protection structure 145 is an electrically insulation structure or a protective device structure. The protective device structure may for example form a part of an npn-structure, a pnp-structure, back-to-back Zener diodes, a Schottky-diode-structure or a punch-through-structure. Said exemplary structures (npn-structure, pnp-structure, back-to-back Zener diodes, Schottky-diode-structure, punch-through-structure) may additionally be formed by the contact plug 111 and/or the trench electrode 141 itself. For example, if the trench electrode 141 of the first trench 14 is formed by a p-type poly-crystalline semiconductor material, the pnp-structure may be used for formation of back-to-back Zener diodes or a punch-through-structure. Materials used for forming the protective device structure may include one or more of a poly-crystalline semiconductor material and a thin dielectric material.

In the latter case (protective device structure), it can for example be ensured, based on the protection structure 145, that a voltage between the electrical potential of the contact plug 111 and the electrical potential of the trench electrode 141 remains below a level defined at least partially by the protective device structure.

In the first case (according to which the protection structure is an insulation structure), the protection structure 145 may comprise a dielectric layer or be a dielectric layer.

The protection structure 145 can further have one of multiple possible positions and one of multiple possible spatial designs. For example, referring to FIG. 3, variant (a) and variant (d), the protection structure 145 may isolate an upper portion 143 of the first trench 14 from the trench electrode 141. The upper portion 143 may be configured in various manners. E.g., the upper portion 143 is an insulating material or an electrically conductive material. The upper portion 143 may be arranged in contact with contact plug 111. The contact plug 111 may hence adjoin the upper portion 143 of the first trench 14. Depending on the design/position of the protection structure 145, the upper trench portion 143 may extend along the entire width of the first trench 14 (cf. variants (b) and (e))) or partially (cf. variants (a) and (d) in FIG. 3). Or, the protection structure 145 itself forms the upper portion 143 of the first trench 14, either only partially along the trench width, as illustrated (cf. variants (c) and (f) in FIG. 3), or along the entire trench width.

As explained above, in case of the protection structure 145 being implemented as said protective device structure, a npn-structure, a pnp-structure, back-to-back Zener diodes, a Schottky-diode-structure, or a punch-through-structure may be formed based on the protective device structure, wherein additionally the contact plug 111 and/or the trench electrode 141 itself may contribute in forming such structure. In addition, the upper portion 143 of the first trench 14 may also contribute to forming such npn-structure, pnp-structure, back-to-back Zener diodes, Schottky-diode-structure, or a punch-through-structure.

Thus, depending on the position/spatial design of protection structure 145, the trench electrode 141 of the first trench 14 may exhibit a width in the first lateral direction X that varies along the vertical direction Z (cf. variants (a), (c), (d) and (f) in FIG. 3). For example, in a portion of the first trench 14 into which the protection structure 145 and/or the contact plug 111 extend(s), the width of the trench electrode 141 may be smaller as compared to another (e.g., lower) portion of the first trench 14. For example, the portion of the first trench into which the protection structure 145 and/or the contact plug 111 extend(s) and where the trench electrode width may be reduced is a top portion of the first trench 14.

Further, regarding variants (a)-(f) of FIG. 3, a lateral distance in the first lateral direction X between the contact plug 111 and the trench insulator 142 of the second trench 14 can be within a specific range, e.g., by amounting at most 1 μm and/or at least 150 nm. In some examples, said lateral distance is at most 250 nm, e.g., at most 200 nm. For example, the contact plug 111 does neither adjoin the second trench 14 nor laterally overlap with the second trench 14, but is laterally displaced therefrom.

Figure 4:
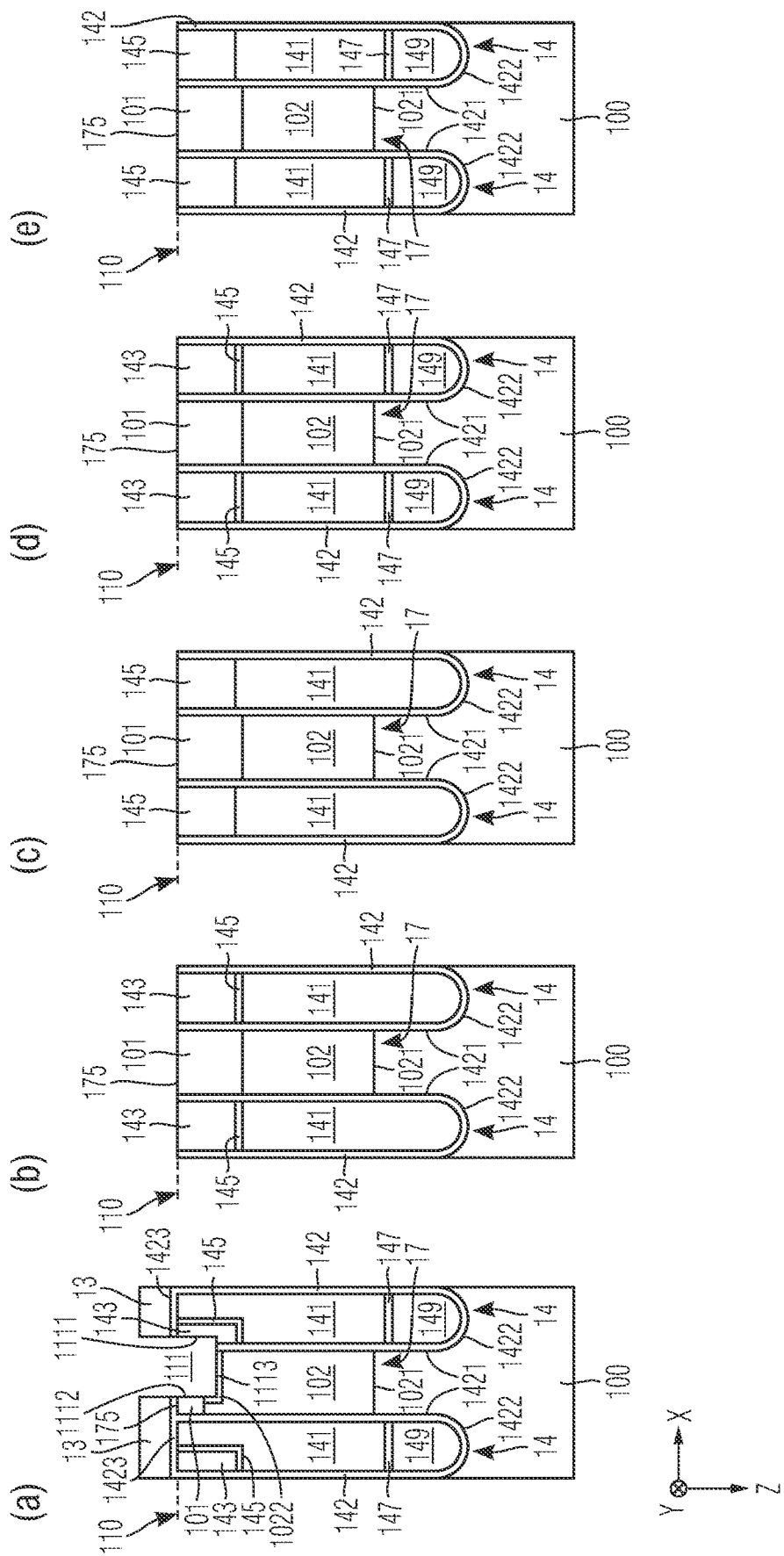

With regards to FIG. 4, further embodiments are explained. In accordance with variant (a), the first trench 14, which with respect to its upper portion is configured as in variant (a) of FIG. 3, may additionally include a further insulation structure 147, such that an additional trench electrode 149 may be formed within the first trench 14. The first trench 14 may hence be a multi-trench-electrode trench. For example, the further insulation structure 147 electrically insulates the trench electrode 141 from the additional trench electrode 149. The same applies to the second trench 14. The additional trench electrode 149, e.g., arranged in a lower portion of the first trench 14, may be connected to the same electrical potential as the trench electrode 141 (which may be the gate/control potential), be electrically floating or, respectively, be connected to another electrical potential, such as to the electrical potential of the first load terminal 11.

In accordance with variants (b) to (e) of FIG. 4, the contact plug 111 (not illustrated) may be configured as a flat contact that is arranged entirely above the surface part 175 and in contact therewith. For example, the contact plug 111 may laterally overlap with both the first trench 14 and the second trench 14 and may even form the trench covers of both the first trench 14 and the second trench 14. To ensure the electrical insulation between the trench electrodes 141 of the first and second trenches 14, the protection structure 145 is provided in both the first trench 14 and the second trench 14. The explanations regarding possible positions and spatial configurations of the protection structure as well as the possibility of a further insulation structure 147 as provided with respect to FIG. 3 and FIG. 4, variant (a), likewise apply to variants (b)-(e) of FIG. 4.

Figure 5:
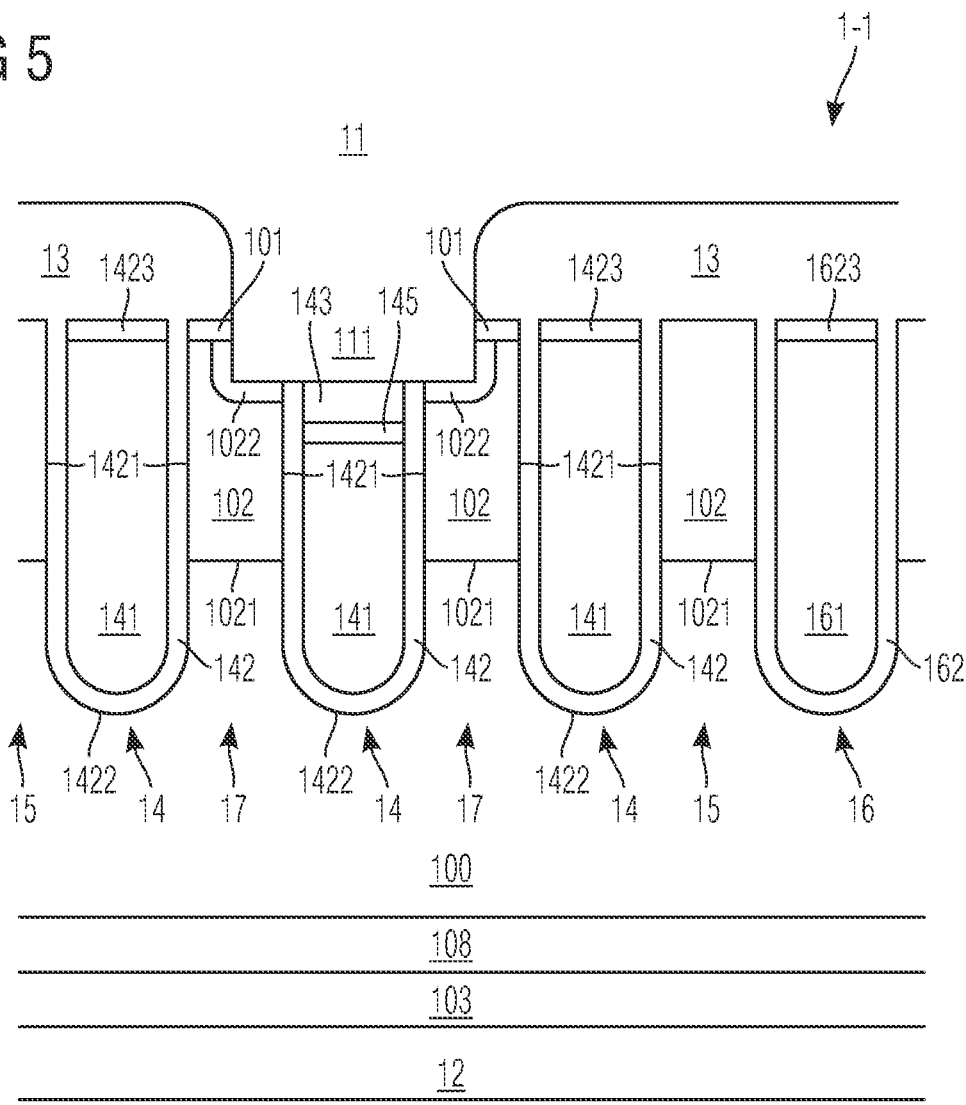

FIG. 5 schematically and exemplarily illustrates a section of a vertical cross-section of the power semiconductor device 1 in accordance with a further embodiment. In accordance with this embodiment, the protection structure 145 entirely covers the trench electrode 141 included in the first trench 14 and thereby forms the trench cover. The contact plug 111 entirely overlaps with the first trench 14 along the first lateral direction X and adjoins into both mesa portions 17 adjacent to the first trench 14 so as to there contact the source regions 101 and body contact regions 1022. For example, the contact plug 111 laterally overlaps with the entire trench electrode 141 of the first trench 14 in the first vertical cross-section but only partially with one or both of the mesa portions 17 laterally adjacent thereto. The contact plug 111 may extend below the surface parts 175 formed by said mesa portions 17.

Further, the power unit cell 1-1 in accordance with the embodiment illustrated in FIG. 5 may include a further trench 16, which may for example be a source trench with its trench electrode 161 being electrically connected to the first load terminal 11, or a dummy trench where the trench electrode 161 would be electrically floating. Besides the different electrical potential of the trench electrode 161, the further trench 16 may be configured as the first trenches 14 (which may be control trenches) adjacent to the first trench 14 that is covered by the contact plug 111, e.g., by including a corresponding trench insulator 162 and by being covered by trench cover 1623. Further, the power unit cell 1-1 in accordance with the embodiment illustrated in FIG. 5 may include a further mesa portion 15, which may be a dummy mesa portion that is not electrically connected to the first load terminal 11 (e.g., by a plug or the like), but where a transition between the first load terminal 11 and the dummy mesa portion 15 along the vertical direction Z is electrically insulating. Or, the further mesa portion 15 may be a diode mesa portion with its body region 102 (but no source region) being electrically connected to the first load terminal 11.

Figure 6:
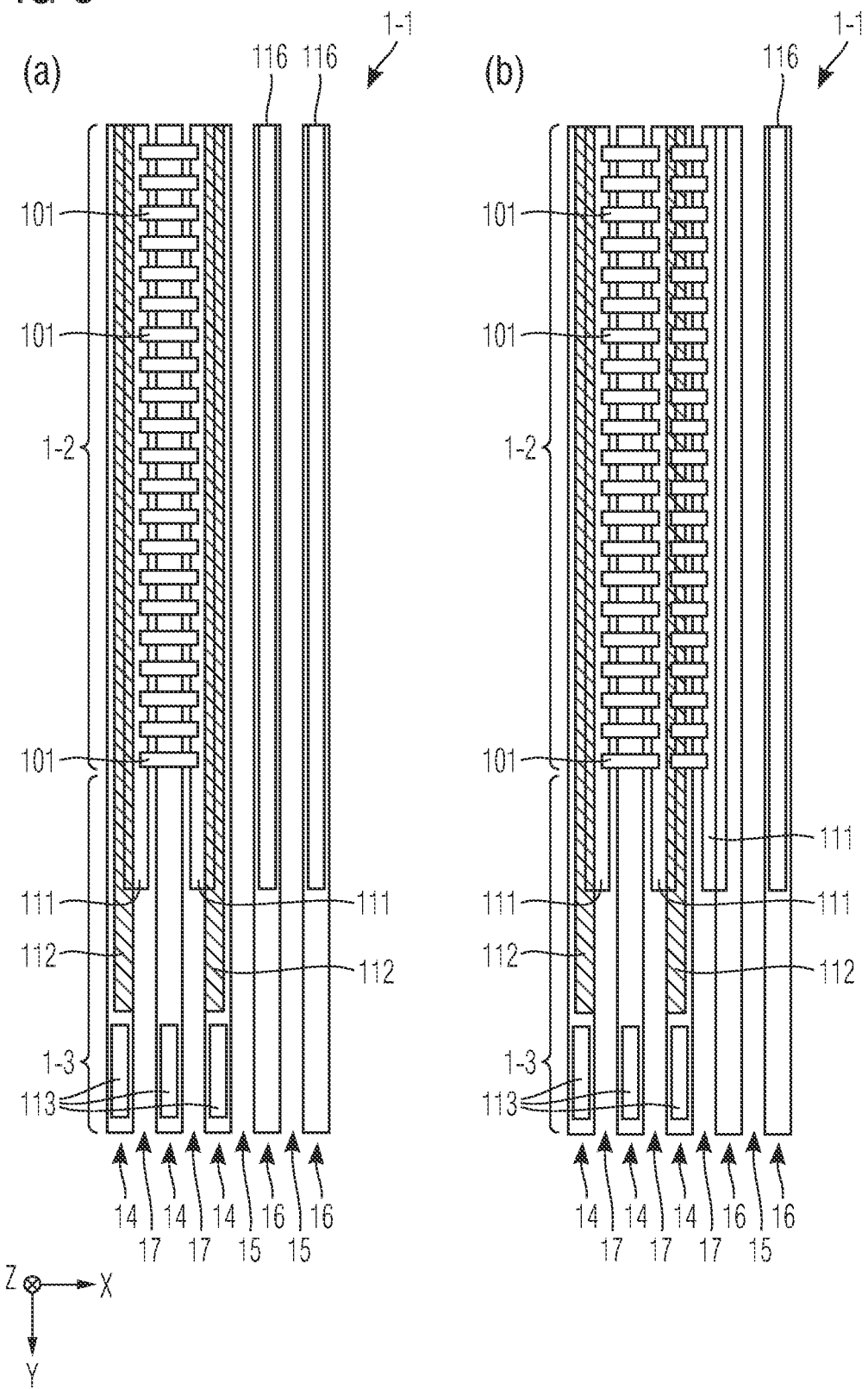
FIGS. 6-7 both schematically and exemplarily illustrate a section of a horizontal projection of a power semiconductor device in accordance with some embodiments.
Figure 7:
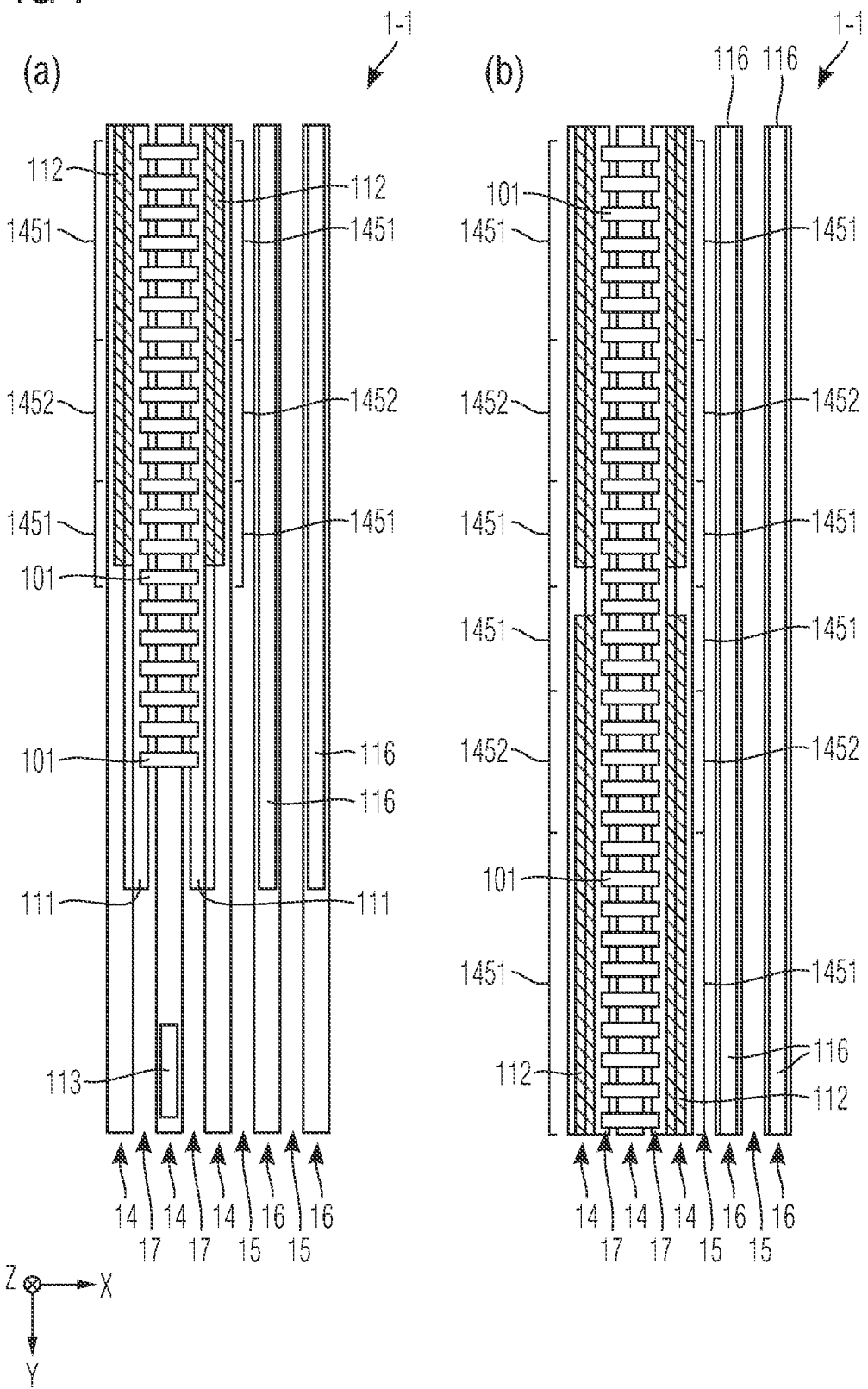

FIGS. 6 and 7 both schematically and exemplarily illustrate a section of a horizontal projection of the power semiconductor device 1 in accordance with one or more embodiments. In accordance with the illustrated variants, in each power unit cell 1-1, three first/second trenches 14 in the form of control trenches are arranged laterally adjacent to each other and laterally confining at two or three mesa portions 17. Adjacent to the three control trenches 14 are two further trenches 16 in the form of source trenches, laterally confining one or two further mesa portions 15.

In accordance with the variants illustrated in FIGS. 6-7, the trench electrodes 161 of the source trenches 16 are electrically connected to the first load terminal 11 based on source contact plugs 116. These source contact plugs 116 may be arranged within the active region 1-2. Alternatively, as illustrated in FIG. 6 (variant b), the trench electrode 161 of the source trench 16 may be contacted by the contact plug 111 that also contacts the neighboring mesa 17; in such case, providing the protection structure 145 in the trench 16 may be omitted, as both the mesa 17 and the trench electrode 161 of the source trench 16 may exhibit the same electrical potential.

In accordance with the variants illustrated in FIGS. 6-7, power semiconductor device 1 further comprises a trench contact plug 113 arranged in electrical contact with the trench electrode 141 of the first trench 14. Further, the first trench 14 can be laterally structured along a second lateral direction Y such that both the protection structure 145 and the contact plug 111 (used for contacting the mesa portions 17) are laterally spaced apart from the trench contact plug 113 along the second lateral direction Y. E.g., as illustrated in the trench contact plug(s) 113 may be arranged in the edge termination region 1-3, e.g., so as to adjoin into the both the trench electrodes 141 and a gate runner structure.

In accordance with the variants illustrated in FIGS. 6-7, for contacting the mesa portions 17, the contact plugs 111 are provided within recessed areas 112. For example, the design of the contact plugs 111 corresponds to the design illustrated in FIG. 3, variants (a) and (c).

In accordance with the variants illustrated in FIGS. 6-7, the source regions 101 in the mesa portions 17 are laterally structured along the second lateral direction Y, as exemplarily illustrated in FIG. 6, variant (a). Accordingly, in a respective one of the mesa portions 17, the source region 101 is only locally provided along the length of the mesa portion 17 in the second lateral direction Y. The contact plug 111 may extend contiguously along the second lateral direction Y.

In another embodiment, as best illustrated in FIG. 7 (variant b) the contact plug 111 and/or the protection structure 145 and/or the trench electrode 141 may also be structured along the second lateral direction Y (cf. interruptions of the recessed area 112 in FIG. 7 (variant b)). E.g., along the second lateral direction Y, there may be portions where the protection structure is not provided and where a portion of the contact plug 111 may hence adjoin a portion of the trench electrode 141; then, both the portion of contact plug 111 and the portion of the trench electrode 141 may exhibit the same electrical potential. Thus, the trench-mesa-pattern may vary along the second lateral direction Y, in accordance with an embodiment. For example, the portion of the trench electrode 141 being contacted by contact plug 111 is isolated from the portion(s) of the trench electrode 141 separated from the contact plug 111 based on the protection structure 145.

The design of the power unit cell 1-1 in terms of the trench-mesa-pattern may vary. For example, comparing variants (a) and (b) of FIG. 6, it is possible to provide the power unit cell 1-1 with two mesa portions 17 and two further mesa portions 15 (e.g., dummy mesa portions) or with three mesa portions 17 and one further mesa portion 15. Each of the three mesa portions 17 is contacted by a respective contact plug 111. As illustrated for variant (b) of FIG. 6, one of the mesa portions 17 may be laterally confined by one of the source trenches 16 and one of the control trenches 14.

Regarding FIG. 7, in both variants (a) and (b), the trench-mesa-pattern may be identical to the variant (a) illustrated in FIG. 6. Regarding contacting of the mesa portions 17 and the further mesa portions 15, as well as the trench electrodes 141 of the control trenches 14 and the trench electrodes 161 of the source trenches 16, the above description applies analogously. Variant (a) in FIG. 7 illustrates both a section of the edge termination region 1-3 and the active region 1-2, whereas variant (b) only relates to the active region 1-2.

FIG. 7 illustrates one of the above mentioned possible configurations of the protection structure 145 which is structured along the second lateral direction Y such that portions of the trench electrode 141 may be contacted by the contact plug 111 and other portions may be separated from the contact plug 111 based on the protection structure 145. To ensure that the different portions of the trench electrode 141 may exhibit corresponding different electrical potentials, the trench electrode 141 may be formed by alternatingly arranged (with respect to the second lateral direction Y) portions 1452 of a p-type poly-crystalline material and portions 1451 of an n-type poly-crystalline material, e.g., such that respective two portions 1451 of the n-type poly-crystalline material are separated from each other based on one of the portions 1452 of the p-type poly-crystalline material arranged between said two portions 1451.

Presented herein is also a method of producing a power semiconductor device. According to an embodiment, the method comprises forming a semiconductor body comprising a first surface and a mesa portion, wherein the mesa portion comprises a surface part of the first surface and a body region; at least two trenches extending from the first surface into the semiconductor body along a vertical direction, wherein each of the two trenches comprises a trench electrode and a trench insulator insulating the trench electrode from the semiconductor body, and wherein the mesa portion is laterally confined by the two trenches in a first vertical cross-section along a first lateral direction; a contact plug in contact with the body region, wherein the contact plug and the trench electrode of a first trench of the two trenches laterally overlap at least partially in the first vertical cross-section; and a protection structure. The protection structure has a portion arranged within the first trench. The protection structure is arranged between the contact plug and the trench electrode of the first trench. The protection structure is an electrically insulation structure or a protective device structure. For example, protection structure extends deeper along the vertical direction than both the surface part of the mesa portion and a trench cover of a second trench of the two trenches. In another embodiment, the protection structure is arranged at or above the surface part of the mesa portion and/or at or above the trench cover of the second trench.

Exemplary embodiments of the power semiconductor device production method correspond to the exemplary embodiments of the power semiconductor device 1 described above.

Figure 8:
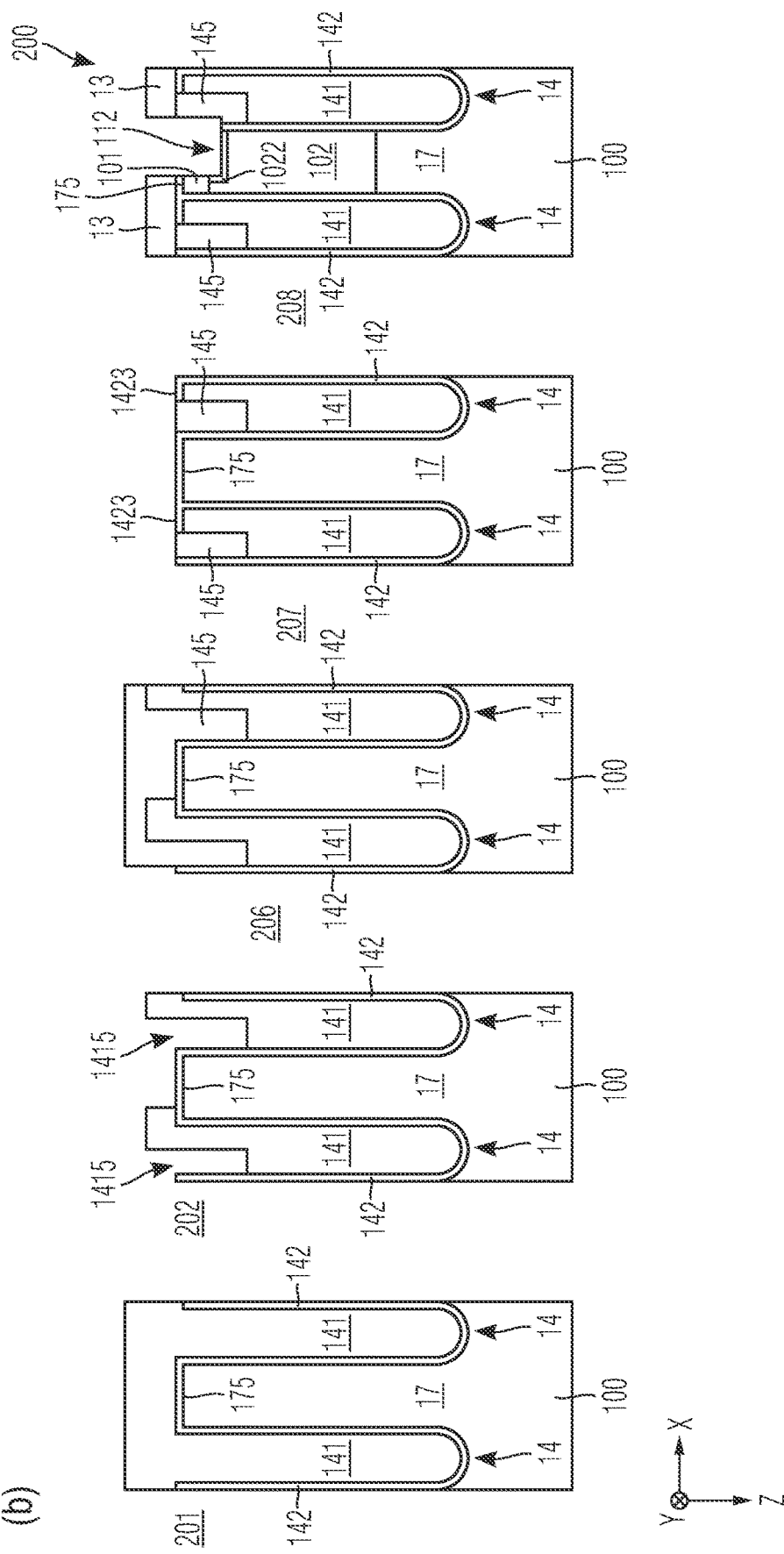
FIG. 8 schematically and exemplarily illustrates, based on sections of a vertical cross-section, a power semiconductor device production method in accordance with some embodiments.

FIG. 8 illustrates an embodiment of the power semiconductor device production method (reference numeral 200) according to two variants, variant (a) with steps 201 to 205, and variant (b) with steps 201, 202 and 206 to 208.

In accordance with both variants (a) and (b), in step 201, the trench electrodes 141 are formed in the first trench 14 and in the second trench 14, e.g., by depositing an electrically conductive material, such as poly-silicon.

Still with respect to both variants, in step 202, recesses 1415 are formed, e.g., based on etch processing step, in the electrically conductive material at positions where the protection structure 145 shall subsequently be implemented.

In accordance with variant (a), step 203 includes forming both the protection structure 145, e.g., as a dielectric layer or a protective device structure, and, above the protection structure 145, the upper trench portion 143, which may include an insulating material or an electrically conductive material. E.g., based on step 203, structures as exemplarily illustrated in FIG. 3, variants (a), (b), (d) and (e) may be formed. In accordance with variant (b), step 206 only includes forming the protection structure 145. There, the protection structure 145 is an electrically insulation structure or a protective device structure and simultaneously forms an upper trench portion. E.g., based on step 206, structures as exemplarily illustrated in FIG. 3, variants (c) and (f) may be formed.

Regarding optional aspects of the protection structure 145 implemented as the protective device structure and/or optional aspects of the trench electrode 141, it is referred to the above description which analogously applies for the method. For example, in case of a protective device structure implemented as a Zener-diode-structure, a highly doped npn-structure may be deposited that forms two back-to-back Zener diodes. Each Zener diode may have, at the pn-junction, a transition region with a lower effective doping with respect to n and p regions.

In accordance with both variants (a) and (b), step 204 or, respectively, step 207 includes a planarization processing step and/or a trench cover formation process, like an oxidation processing step, such that a substantially planar surface above the surface part 175 of the mesa portion 17 is achieved based at least on trench covers 1423. In the planarization processing step, a protruding part of the trench electrode 141, a protruding part of the trench insulator 142 and a protruding part of the protection structure 145 may be removed. The protruding part may be the part of the trench electrode 141, the trench insulator 142, or the protection structure 145, respectively, that protrudes above the surface part 175 of the mesa portion 17 against the vertical direction Z.

In accordance with both variants (a) and (b), step 205 or, respectively, step 208 includes a plurality of processing steps, such as one or more implantation processing steps and one or more diffusion processing steps that are carried out to form each of the body region 102, the contact portion 1022 of the body region 102 and the source region 101.

Further included may be a deposition processing step for forming the first insulation layer 13. Further, an etch processing step may be carried out to form the recessed area 112 (e.g., contact groove 112) into which an electrically conductive material, e.g., including a metal, may be deposited for forming the contact plug 111.

In the above, embodiments pertaining to power semiconductor device, such as MOSFETs, IGBTs, RC IGBTs and derivatives thereof, and corresponding processing methods were explained. For example, these power semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide (SixCl-x) and silicon-SiGe heterojunction semiconductor materials. For power semiconductor switches applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device, comprising:
    a semiconductor body comprising a first surface and a mesa portion, wherein the mesa portion comprises a surface part of the first surface and a body region;
    at least two trenches extending from the first surface into the semiconductor body along a vertical direction, wherein each of the at least two trenches comprises a trench electrode and a trench insulator insulating the trench electrode from the semiconductor body, wherein the mesa portion is laterally confined by the at least two trenches in a first vertical cross-section along a first lateral direction;
    a contact plug in contact with the body region, wherein the contact plug and the trench electrode of a first trench of the at least two trenches laterally overlap at least partially in the first vertical cross-section; and
    a protection structure, wherein the protection structure:
        has a portion arranged within the first trench;
        is arranged between the contact plug and the trench electrode of the first trench;
        extends deeper along the vertical direction than both the surface part of the mesa portion and a trench cover of a second trench of the at least two trenches; and
        is an electrically insulation structure or a protective device structure.

2. The power semiconductor device of claim 1, wherein the mesa portion comprises a source region, and wherein the contact plug is also in contact with the source region.

3. The power semiconductor device of claim 2, wherein the contact plug extends further along the vertical direction than the source region.

4. The power semiconductor device of claim 2, wherein the contact plug includes a first side surface, a second side surface and a bottom surface, and wherein the first side surface adjoins the first trench, the bottom surface adjoins the body region and the second side surface adjoins the source region.

5. The power semiconductor device of claim 1, wherein the protection structure comprises a dielectric layer or is a dielectric layer.

6. The power semiconductor device of claim 1, wherein the protection structure is the protective device structure and forms a part of:
    an npn-structure;
    a pnp-structure;
    back-to-back Zener diodes;
    a Schottky-diode-structure; or
    a punch-through-structure.

7. The power semiconductor device of claim 1, wherein the contact plug laterally overlaps with the entire trench electrode of the first trench in the first vertical cross-section, and wherein the contact plug only partially laterally overlaps with the mesa portion in the first vertical cross-section.

8. The power semiconductor device of claim 7, further comprising at least two first trenches, wherein the contact plug laterally overlaps with the at least two first trenches in the vertical cross-section.

9. The power semiconductor device of claim 1, wherein the contact plug is laterally spaced apart from the second trench in the vertical cross-section along the first lateral direction.

10. The power semiconductor device of claim 1, wherein the contact plug adjoins a part of a trench sidewall of the first trench.

11. The power semiconductor device of claim 1, wherein a part of the trench insulator of the first trench is located between the contact plug and the trench electrode of the first trench.

12. The power semiconductor device of claim 1, wherein a lateral distance in the first lateral direction between the contact plug and the trench insulator of the second trench is at most 1 μm and/or at least 150 nm.

13. The power semiconductor device of claim 1, wherein the body region includes a contact portion with a locally increased dopant concentration, and wherein the contact plug adjoins the contact portion.

14. The power semiconductor device of claim 1, wherein the first trench is a multi-trench-electrode trench.

15. The power semiconductor device of claim 1, further comprising a trench contact plug arranged in electrical contact with the trench electrode of the first trench, wherein the first trench is laterally structured along a second lateral direction such that both the protection structure and the contact plug are laterally spaced apart from the trench contact plug along the second lateral direction.

16. The power semiconductor device of claim 1, wherein the contact plug is electrically insulated from the trench electrode of the first trench at least based on the protection structure.

17. A method of producing a power semiconductor device, the method comprising:
    forming at least two trenches in a semiconductor body having a first surface such that the at least two trenches extend from the first surface into the semiconductor body along a vertical direction and the at least two trenches laterally confine a mesa portion of the semiconductor body in a first vertical cross-section along a first lateral direction, wherein the mesa portion comprises a surface part of the first surface and a body region; and
    forming, in the at least two trenches, a trench electrode and a trench insulator insulating the trench electrode from the semiconductor body;
    forming a protection structure, wherein the protection structure has a portion arranged within the first trench, extends deeper along the vertical direction than both the surface part of the mesa portion and a trench cover of a second trench of the two trenches, and is an electrically insulation structure or a protective device structure; and
    forming a contact plug in contact with the body region, wherein the contact plug and the trench electrode of a first trench of the at least two trenches laterally overlap at least partially in the first vertical cross-section, wherein the contact plug and the protection structure are formed such that the protection structure is arranged between the contact plug and the trench electrode of the first trench.

18. The method of claim 17, wherein forming the protection structure comprises:
    removing at least a part of the trench electrode of the first trench to form a recess in the first trench; and
    forming at least a portion of the protection structure in the recess.

19. The method of claim 17, wherein forming the contact plug comprises:
    removing at least a part of the mesa portion and of the protection structure to form a recessed area; and
    depositing an electrically conductive material in the recessed area.

20. The method of claim 17, further comprising a planarization processing step and/or a trench cover formation process after forming the protection structure and before forming the contact plug such that a substantially planar surface above the surface part of the mesa portion is achieved based at least on the trench cover of the at least two trenches.

* * * * *